United States Patent [19]

Igarashi et al.

[11] Patent Number: 5,189,372
[45] Date of Patent: Feb. 23, 1993

[54] SILENCER FOR MAGNETIC FIELD GRADIENT COILS IN A MAGNETIC RESONANCE IMAGING APPARATUS

[75] Inventors: Yoshiki Igarashi; Goh Miyajima, both of Katsuta, Japan

[73] Assignee: Hitachi, Ltd., Tokyo, Japan

[21] Appl. No.: 730,095

[22] Filed: Jul. 15, 1991

[30] Foreign Application Priority Data

Jul. 16, 1990 [JP] Japan .................. 2-187699

[51] Int. Cl.⁵ ............................................. G01R 33/20
[52] U.S. Cl. ................................................. 324/318
[58] Field of Search ............... 324/300, 307, 309, 318, 324/319, 320, 322; 128/653.5

[56] References Cited

U.S. PATENT DOCUMENTS

| | | | |
|---|---|---|---|
| 4,126,823 | 11/1978 | Dalton, Jr. ........................... | 324/301 |
| 4,260,949 | 10/1981 | Dalton, Jr. ........................... | 324/302 |
| 4,472,683 | 9/1984 | Sekihara et al. ..................... | 324/309 |
| 4,558,425 | 12/1985 | Yamamoto et al. .................. | 364/555 |
| 4,737,715 | 4/1988 | Ikeda et al. .......................... | 324/318 |
| 4,875,013 | 10/1989 | Murakami et al. ................... | 324/318 |
| 4,905,316 | 2/1990 | Okamoto .............................. | 324/319 |
| 5,084,676 | 1/1992 | Saho et al. ............................ | 324/318 |
| 5,109,198 | 4/1992 | Murakami et al. ................... | 324/318 |

Primary Examiner—Michael J. Tokar
Attorney, Agent, or Firm—Antonelli, Terry, Stout & Kraus

[57] ABSTRACT

A silencer for a plurality of magnetic field gradient coils in a magnetic resonance imaging apparatus, comprising a magnet for generating a stationary magnetic field, a bobbin which holds the plurality of inclined magnetic field gradient coils disposed within the magnet for generating in the stationary magnetic field gradients to impart positional information to a magnetic resonance signal, and a silencer provided between an internal space between the magnet and the bobbin and a space outside the magnet for reducing the diffusion of noise occurring due to an electric current flowing through the plurality of magnetic field gradient coils to the external space through the internal space.

5 Claims, 2 Drawing Sheets

SILENCER FOR MAGNETIC FIELD GRADIENT COILS IN A MAGNETIC RESONANCE IMAGING APPARATUS

BACKGROUND OF THE INVENTION

The present invention relates to a silencer in magnetic field gradient coils in magnetic resonance imaging (MRI) apparatus, and more particularly to such silencer which reduces vibration noise generated by magnetic field gradient coils which generate magnetic field gradients to impart positional data to a magnetic resonance signal.

An MRI apparatus comprises a bed on which an object undergoing examination such as a human patient lies down, a measuring cylindrical bobbin having an internal space in which the bed is accommodated, a magnet which generates a stationary magnetic field to cause a nuclear magnetic resonance phenomenon in the object in the internal space, and a plurality of magnetic field gradient coils which generate various magnetic field gradients in the X, Y, Z axial directions. The magnetic field gradient coils are disposed along the outer periphery of the bobbin. In order to generate the magnetic field gradients, it is necessary to flow big pulse-like currents through the magnetic field gradient coils in which case the coils vibrate and generate a large percussion sound between the coils and the bobbin. This sound becomes noise which is very uncomfortable to an object undergoing examination or a patient.

Various attempts have been made to reduce the percussion noise produced between the bobbin and the coils at the generation of the magnetic field gradients. Main conventional means for reducing such noise is to use a damping material and/or a sound absorbing material in the bobbin.

A conventional noise reducer in an MRI apparatus is dedicated to reduction of only percussion noise occurring between the bobbin and the magnetic field gradient coils and traveling through the bobbin into the internal bobbin space or toward the patient. This applies, for example, to a silencer disclosed in JP-A-1-201247.

The applicants of the present invention have found that noise appearing in the external bobbin space is actually larger than that generated from the internal bobbin space when they examined the place where the noise was generated in the MRI apparatus.

A source of percussion noise is considered to be in a plane where the bobbin and the coils contact. Since the bobbin itself is a vibration transmitting member for sounds generated in the internal bobbin space, noise is easily reduced by attaching a buffering material to the bobbin. While a space is formed around the outer periphery of the bobbin, it is narrow, so that it is difficult to provide means for noise reducing purposes. In addition, provision of the space is necessary, so that no measures are conventionally taken for that purpose. Thus, even if noise reducing means is provided against noise appearing in the internal bobbin space, the noise cannot be reduced to a required enough level.

SUMMARY OF THE INVENTION

It is an object of the present invention to provide a silencer for magnetic field gradient coils in a MRI apparatus which reduces percussion noise generated between the magnetic field gradient coils and a bobbin which supports the coils along their outer peripheries and transmitted to the external bobbin space and hence greatly reduce noise generated from the overall electromagnet unit.

According to the present invention, in an MRI in which a plurality of magnetic field gradient coils which generates various magnetic field gradients in a stationary magnetic field is provided around the outer periphery of a cylindrical bobbin in the internal space of which an object undergoing examination is set, a silencer is provided which reduces noise generated in a space formed outside of the bobbin.

In the silencer for the magnetic field gradient coils according to the present invention, when a large pulse-like current flows through the coils, the coils vibrate to impact on the bobbin to thereby generate large noise. The silencer reduces that portion of noise generated in the space outside the bobbin. The number of silencers attached is optional. The places where the silencers are to be attached are preferably at the outer peripheries of the bobbin ends. While various silencers different in noise eliminating performance can be provided, they may be formed especially so as to have low-frequency noise eliminating performance.

DESCRIPTION OF THE PREFERRED EMBODIMENT

An embodiment of the present invention will now be described with reference to the drawings.

Figure 1:
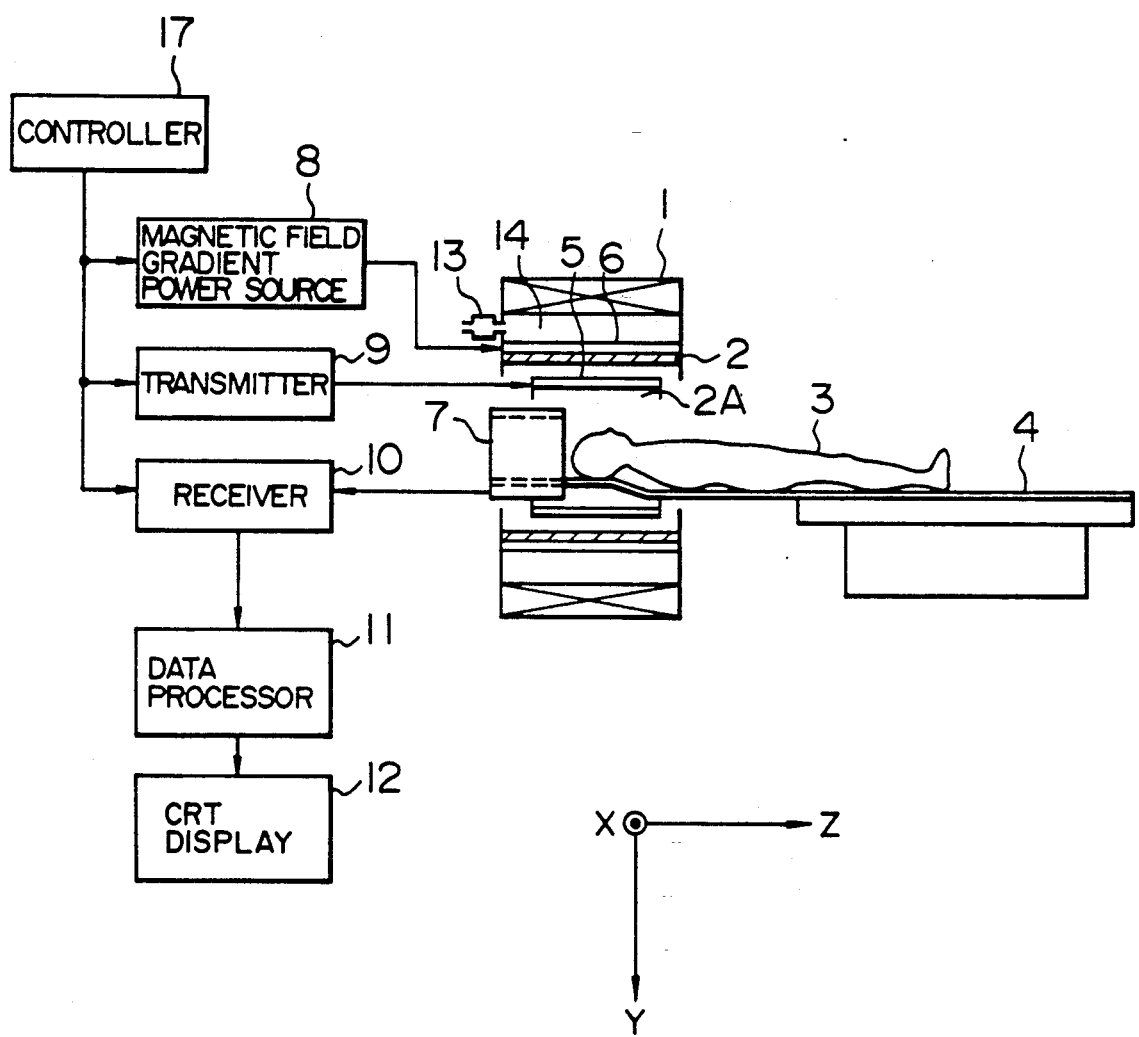
FIG. 1 is a schematic of the overall system of an MRI apparatus to which a silencer according to the present invention is applied.

FIG. 1 conceptually illustrates the entire system structure of an MRI apparatus to which the inventive silencer is applied. In FIG. 1, reference numeral 1 denotes a magnet made, for example, of a superconductive magnet which ensures provision of a measurement space and forms a stationary magnetic field $H_0$ in the internal space 2A in a bobbin 2 which attaches magnetic field gradient coils 6 on the outer periphery thereof. A portion of an object or human patient 3 undergoing examination is accommodated in the inner space 2A where the stationary magnetic field is formed with the person 3 lying down on a bed 4. An irradiation coil 5 is disposed in the neighboring space around of the person 3 in the inner space 2A. Magnetic field gradient coils 6 are disposed around the outer periphery of the bobbin 2. Reference numeral 7 denotes a receiving coil disposed in the vicinity of the head of the person 3. The gradient coils 6 are supplied with a pulse-like exciting drive current from a magnetic field gradient power source 8 to generate a magnetic field gradient $H_{GC}$. The coils 6 include three magnetic field gradient coil windings attached in a predetermined positional relationship in order to generate independent magnetic field gradients in the X, Y and Z axial directions orthogonal one to the other. Irradiation coil 5 is connected to a transmitter 9 which delivers to irradiation coil 5 a high frequency signal to generate a high frequency magnetic field in order to obtain a magnetic resonance signal.

A magnetic resonance signal is generated within a measured portion of the person 3 due to the interaction of the stationary magnetic field $H_0$, the magnetic field gradient $H_{GC}$ and the high frequency magnetic field. This magnetic resonance signal especially includes positional information on the basis of the action of the magnetic field gradients. The magnetic resonance signal thus generated is detected by the receiving coil 7 and amplified and detected by the receiver 10. The signal from the receiver 10 is processed so as to reconstruct an image by the next stage data processor 11. The data deriving from such data processing is delivered to a CRT display 12 to display the examined image from the person 3.

A controller 17 delivers a control signal to the magnetic field gradient power source 8, high frequency transmitter 9 and receiver 10 to provide control over the operation and operative timing of these devices on the basis of sequential control.

The magnetic field gradient coils 6 with the coil windings to generate magnetic field gradients in the X, Y and Z directions are driven by magnetic field gradient power source 8, as mentioned above. Thus, positional data is added to the magnetic resonance signal by the magnetic field gradients generated for the respective axes.

The coils 6 are rapidly supplied with a large current of 0-100 amperes in a short time, for example, of one millisecond, and the above operation is iterated at intervals of several milliseconds separately for the respective magnetic field gradient coil windings provided in the three axial directions. Since the magnetic field gradient coils 6 which rapidly change the currents in a pulse-like manner are disposed in the stationary magnetic field $H_0$, the coils vibrate to impact on the bobbin 2 which holds the gradient coils to thereby generate large noise. For example, when the magnetic field gradient is 0.3 gausses/cm in conventional magnetic field gradient coils having a diameter of about 700 mm in a stationary magnetic field, for example, of $H_0=0.5$ teslas (T) and which is insufficient to reduce noise at a distance of 1 m from magnet 1, noise of 60-70 phons is generated in the magnetic field gradient coils. If the magnetic field gradients or stationary magnetic field increases, noise rapidly increases and exceeds 100 phons at $H_0=0.15$ teslas.

In order to reduce such noise, silencers 13 are provided in the present embodiment. As shown in FIG. 1, a hermetic space 14 is formed between magnet 1 and magnetic field gradient coils 6. Noise generated as mentioned above transmits through the hermetic space 14 to the outside. silencers 13 reduce the noise generated on the hermetic space side outside the bobbin 2. A more detailed description will be given with respect to FIG. 2.

Figure 2:
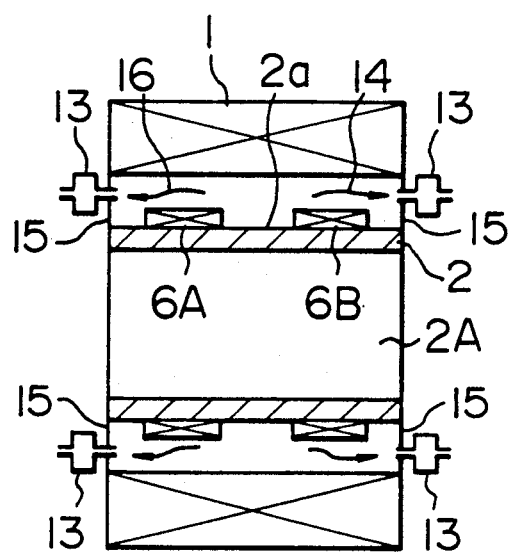
FIG. 2 is a schematic of an electromagnet unit shown on enlarged scale.

Specifically, FIG. 2 shows the electromagnet unit on enlarged scale. In FIG. 2, as mentioned above, reference numeral 1 denotes stationary magnetic field generating magnet; 2, cylindrical bobbin which supports magnetic field gradient coils 6; 2A, internal space where measurement is made; 6A, 6B, magnetic field gradient coil windings which constitute part of magnetic field gradient coils 6. The hermetic space 14 is formed between the inner wall la of magnet 1 and the outer wall 2a of the bobbin 2. Silencers 13 are disposed at each of the outer end peripheries 15 of bobbin 2 so as to communicate acoustically with the hermetic space 14. Therefore, noise 16 generated as shown by the arrow in the hermetic space 15 due to vibrations of the magnetic field gradient coils 6A, 6B arrives at silencers 13 which reduce the vibrating energy of the noise. While there are various types of silencers, silencers of acoustic resonance absorption structure may be used.

While in the arrangement of FIG. 2 the plurality of silencers 13 is shown as being disposed, the number of silencers is optional. The places where the silencers are disposed are not limited to the outer end surfaces 15 so long as they can reduce noise generated in the hermetic space 14.

Figure 3:
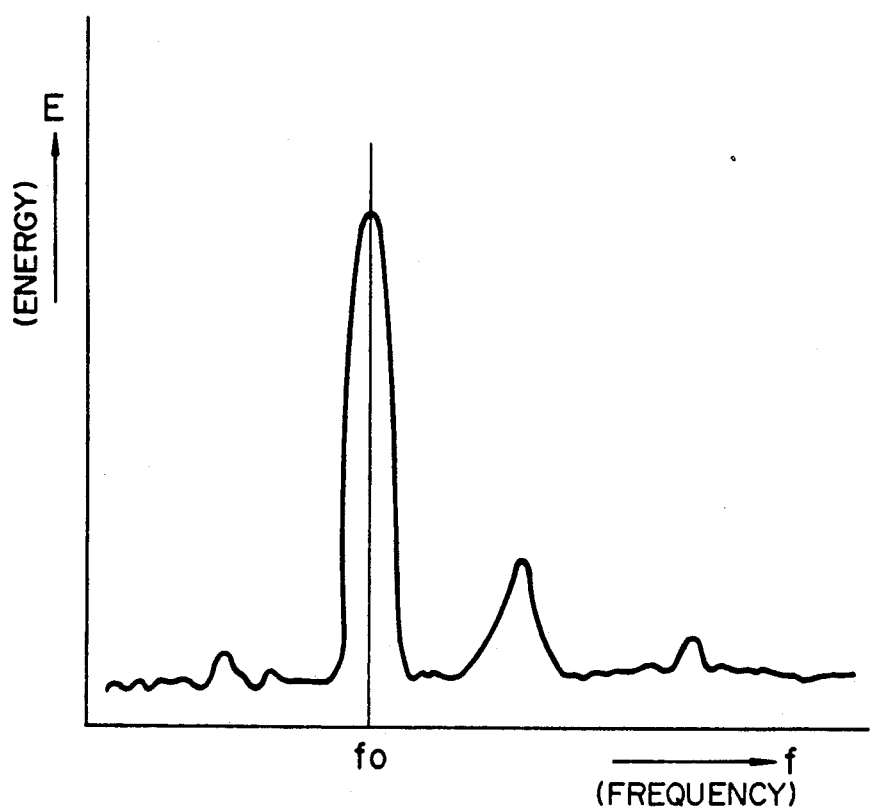
FIG. 3 is a waveform showing one example of noise spectrum.

FIG. 3 shows a waveform of a typical noise spectrum. The frequency $f_0$ shown in FIG. 3 is the frequency in a sound region where the noise energy is maximum and occurs in the vicinity of 270 Hz in a certain MRI apparatus. The silencers 13 are usually set so as to resonate to that frequency $f_0$ and absorb it to thereby attenuate substantial noise energy. The frequency $f_0$ occurs generally in a low frequency region. In an example of measurement, the frequency $f_0$ occurred in the vicinity of 270 Hz when the stationary magnetic field $H_0$ was 1.5 teslas. The sound pressure at that time was 94 dB in a C-characteristic (the sound pressure level has an A- and a C-characteristic, the A-characteristic being an acoustic corrected version of the C-characteristic) at a distance of 1 m before the MRI apparatus. By setting the resonant frequency of the silencers 13 at $f_0$ which is a low frequency, the vibrating low frequency energy and hence noise are reduced considerably.

As mentioned above, by using the silencers 13, the resonant frequency can be set at any value, so that noise in the low frequency region which is difficult to attenuate with a noise absorbing or sound-proof material can be easily be attenuated.

We claim:

1. A silencer for a plurality of magnetic field gradient coils in a magnetic resonance imaging apparatus, comprising:
    a magnet for generating a stationary magnetic field;
    said plurality of inclined magnetic field gradient coils disposed within said magnet for generating in the stationary magnetic field gradients to impart positional information to a magnetic resonance signal;
    a bobbin for holding said plurality of magnetic field gradient coils;
    a high frequency coil for transmitting a high frequency magnetic field to an object undergoing examination disposed within said bobbin;
    a receiving coil for receiving a nuclear magnetic resonance signal occurring in the object;
    a data processor for processing the nuclear magnetic resonance signal received by said receiving coil to reconstruct an image; and
    a silencer provided between an internal space between said magnet and said bobbin and a space outside said magnet for reducing the diffusion of noise occurring due to an electric current flowing through said plurality of magnetic field gradient coils to the external space through the internal space.

2. A silencer according to claim 1, comprising:
    means for hermetically sealing the internal space and wherein the internal space communicates acoustically with external space through said silencer.

3. A silencer according to claim 2, wherein said hermetically sealing means includes an outer peripheral wall provided at each of the ends of the internal space.

4. A silencer according to claim 3, wherein said silencer is provided at least one of said outer peripheral walls.

5. A silencer according to claim 1, wherein said silencer reduces frequency components having the highest strength among the noise.

* * * * *